(12) United States Patent
Cai et al.

(10) Patent No.: US 12,188,984 B1
(45) Date of Patent: Jan. 7, 2025

(54) CIRCUIT AND METHOD FOR POST-BINDING TESTING OF 2.5D CHIPLET

(71) Applicants: Nanjing University Of Posts And Telecommunications, Jiangsu (CN); NANTONG INSTITUTE OF NANJING UNIVERSITY OF POSTS AND TELECOMMUNICATIONS CO., LTD., Jiangsu (CN)

(72) Inventors: Zhikuang Cai, Jiangsu (CN); Guopeng Zhou, Jiangsu (CN); Haijun Shen, Jiangsu (CN); Binbin Xu, Jiangsu (CN); Jiafei Yao, Jiangsu (CN); Henglu Wang, Jiangsu (CN); Zushuai Xie, Jiangsu (CN); Jian Xiao, Jiangsu (CN); Zixuan Wang, Jiangsu (CN); Yufeng Guo, Jiangsu (CN)

(73) Assignees: Nanjing University Of Posts And Telecommunications, Jiangsu (CN); NANTONG INSTITUTE OF NANJING UNIVERSITY OF POSTS AND TELECOMMUNICATIONS CO., LTD., Jiangsu (CN)

( * ) Notice: Subject to any disclaimer, the term of this patent is extended or adjusted under 35 U.S.C. 154(b) by 0 days.

(21) Appl. No.: 18/274,466

(22) PCT Filed: Jan. 10, 2023

(86) PCT No.: PCT/CN2023/071577
§ 371 (c)(1),
(2) Date: Jul. 27, 2023

(87) PCT Pub. No.: WO2024/027110
PCT Pub. Date: Feb. 8, 2024

(30) Foreign Application Priority Data

Aug. 4, 2022 (CN) .......................... 202210931419.3

(51) Int. Cl.
*G01R 31/28* (2006.01)
*G01R 31/3185* (2006.01)

(52) U.S. Cl.
CPC .......................... *G01R 31/318597* (2013.01)

(58) Field of Classification Search
None
See application file for complete search history.

(56) References Cited

U.S. PATENT DOCUMENTS 1,613,968 A * 1/1927 Stokes ................... B65D 27/00
229/68.1
12,099,086 B2 * 9/2024 Cai ..................... G01R 31/2884
(Continued)

FOREIGN PATENT DOCUMENTS

| CN | 102880536 | 1/2013 |
| CN | 109473361 | 3/2019 |

(Continued)

OTHER PUBLICATIONS

"International Search Report (Form PCT/ISA/210) of PCT/CN2023/071577," mailed on May 29, 2023, pp. 1-3.

(Continued)

*Primary Examiner* — Jermele M Hollington
(74) *Attorney, Agent, or Firm* — JCIPRNET (57) ABSTRACT

A circuit for post-binding testing of a 2.5D chiplet includes an interposer-dedicated TAP controller, an interposer test interface circuit and a chiplet test output control circuit. A chiplet test configuration register and its corresponding instructions are newly added for the interposer-dedicated TAP controller. The interposer test interface circuit uses an output control signal of the chiplet test configuration register to select the opening or closing of a test signal channel between an interposer and a chiplet. The chiplet test output control circuit uses the chiplet test configuration register to (Continued)

output a control signal for control of a test data output of the chiplet on the interposer.

8 Claims, 8 Drawing Sheets

(56) References Cited

U.S. PATENT DOCUMENTS

2010/0174958 A1    7/2010   Maeda et al.
2023/0184831 A1*   6/2023   Huang ........... G01R 31/318594

FOREIGN PATENT DOCUMENTS

| CN | 111183517 | 5/2020 |
| CN | 112595966 | 4/2021 |
| CN | 114253184 | 3/2022 |
| CN | 115020266 | 9/2022 |

OTHER PUBLICATIONS

"Written Opinion of the International Searching Authority (Form PCT/ISA/237) of PCT/CN2023/071577," mailed on May 29, 2023, with English translation thereof, pp. 1-11.

* cited by examiner

CIRCUIT AND METHOD FOR POST-BINDING TESTING OF 2.5D CHIPLET

CROSS-REFERENCE TO RELATED APPLICATION

This application is a 371 of international application of PCT application serial no. PCT/CN2023/071577, filed on Jan. 10, 2023, which claims the priority benefit of China application no. 202210931419.3, filed on Aug. 4, 2022. The entirety of each of the above-mentioned patent applications is hereby incorporated by reference herein and made a part of this specification.

TECHNICAL FIELD

The present disclosure relates to the field of design-for-test circuits for chiplets, and in particular to a circuit for post-binding testing of 2.5D chiplet, which belongs to the technical field of testing or measuring semiconductor devices during manufacturing or processing.

DESCRIPTION OF RELATED ART

In the case of increasingly higher chip integration and smaller process nodes, the method of improving chip performance by purely relying on technology can no longer meet the needs of the integrated circuit market, the chiplet technology as a solution is the most prominent advanced chip design technology in the post-Moore era. In the technology, a chiplet-based network-on-chip communication architecture is established based on the development of a variety of chiplets with a single specific function that can be modularly assembled with each other, and finally, all components are bonded into a system-level chip through advanced packaging technologies such as system-in-package.

The design complexity and high integration level of chiplets lead to a greatly increased probability of defects and failures in the chiplets during manufacturing and use, and the failure of one of the chiplets will affect the performance of the overall chiplet circuit. In order to increase the speed to market of chiplet products, however, most chiplets are IP products purchased directly from third parties, and the test hardware resources therein have been completed and cannot be changed. Before the chiplets are bonded, they can be tested by accessing respective test structures through their own test ports. However, since the chiplets are limited by the number of pins and have a complex stacking structure, how to solve the testing problem of chiplets after bonded to an interposer through only a set of JTAG external test ports on the interposer while satisfying the above constraints has become a challenge for chiplet testing.

For the problem of post-binding testing of chiplets across an interposer in the chiplets, a foreign Common Heterogeneous Integration and IP Reuse Strategies (CHIPS) program has made certain technical achievements, while in China, the control of the multi-chiplet test structure is still relatively lacking, mainly because there are more researches on the TSV test of the three-dimensional circuit. The current mainstream test structure in the industry is designed based on the IEEE 1687 standard protocol. Therefore, the 3D test structure based on the IEEE 1149.1 standard protocol needs to be modified to make it compatible with the current mainstream test structure. An automatic chiplet detector circuit capable of detecting upper and lower chiplets, is to integrate the automatic chip detector circuit into a 3D test structure based on the IEEE 1149.1 standard protocol. In the circuit, although the test path configuration time for chiplets in post-binding testing can be saved, the test of a certain chiplet cannot be specified, which lacks flexibility. A 2.5D test structure in which the main chiplet controls the remaining chiplets on an interposer, realizes a one-to-many test access control mechanism. However, once the designated main chiplet is damaged, other chiplets cannot be tested. For all these reasons, the present disclosure aims to propose a technical solution for realizing parallel testing for multiple chiplets or chiplets through a set of JTAG ports, so as to overcome the defects of the existing post-binding parallel testing technology for multiple chiplets.

SUMMARY

The objective of the present disclosure is, in view of the above-mentioned deficiencies in the background technology, to provide a circuit for post-binding testing of 2.5D chiplet based on the test structure of IEEE 1687, which realizes reliable parallel testing or specified individual testing on multiple chiplets through a set of JTAG ports, and solve the technical problems that the existing post-binding parallel testing technology for multiple chiplets is inflexible and the post-binding parallel testing scheme for multiple chiplets of a master-slave architecture cannot perform reliable testing on each chiplet.

The present disclosure adopts the following technical solution to achieve the above objective:

The present disclosure proposes a circuit for post-binding testing of 2.5D chiplet, comprising an interposer-dedicated Test Access Port Controller (TAP controller), an interposer test interface circuit and a chiplet test output control circuit.

The interposer-dedicated TAP controller has a chiplet test configuration register newly added on the basis of a traditional TAP controller. The chiplet test configuration register outputs a control signal SEL_B, and a 1-bit keep signal Keep is additionally designed to keep the control signal unchanged when the chiplets are synchronously reset. A STACK instruction is also defined in the interposer-dedicated TAP controller. An instruction register of the interposer-dedicated TAP controller receives a value of the STACK instruction in a configuration vector from a port of a chip JTAG. After the value is decoded, the chiplet test configuration register is connected in a valid path between a test data input port and a test data output port of the interposer-dedicated TAP controller. A control signal SEL_B for determining tested chiplets under parallel testing and an output sequence of test output signals is generated according to the configuration vector written into the chiplet test configuration register from a TDI port.

The interposer test interface circuit comprises a plurality of logic gates and registers, connects ports tdi, tins, tck, trst and tdo of each chiplet with corresponding ports tdi_b, tins_b, tck_b, trst_b and tdo_b in the test interface circuit to form a test path between the interposer and a chiplet, and then uses the signal SEL_B to select the opening or closing of each test path. The interposer test interface circuit receives in real time a test vector from the port of the port of the chip JTAG, and upon receiving the control signal output by the interposer-dedicated TAP controller, to connect to a test data input port, a test clock signal input port, a test mode selection signal input port, a test reset signal input port and a test data output port of the tested chiplets under parallel testing, where a test clock signal of each tested chiplet that is generated according to the control signal output by the interposer-dedicated TAP controller and a test clock input signal from the port of the port of the chip JTAG is transmitted to the test clock signal input port of each tested chiplet, a test mode selection signal of each tested chiplet that is generated according to the control signal output by the interposer-dedicated TAP controller and a test mode selection signal from the port of the chip JTAG is transmitted to the test mode selection signal input port of each tested chiplet, a test data input signal of each tested chiplet that is shifted in according to the test clock signal of each tested chiplet is transmitted to the test data input port of each tested chiplet, a test reset signal from the port of the chip JTAG is transmitted to the test reset signal input port of each tested chiplet, and a test output signal of each tested chiplet is transmitted to a chiplet test output control circuit.

The chiplet test output control circuit comprises a plurality of data selectors, logic gates and register banks, receives the control signal output by the interposer-dedicated TAP controller, and uses the signal SEL_B to sequentially transmit the test output signal of each tested chiplet to the port of the chip JTAG.

The chiplet test output control circuit incorporates a test output enable signal generated by the TAP controller, captures a valid test output result of a chiplet that is being tested yet not selected for test result outputting by the test data output port for multiple chiplets during parallel testing, and stores the same into a register bank of the chiplet test output control circuit, and then output the data in the register bank having the test result of the chiplet stored therein after the outputting of a test result of a chiplet that is selected for test result outputting by the test data output port has been completed.

The present disclosure, by adopting the above technical solution, has the following advantageous effects:

(1) The present disclosure provides a circuit for post-binding testing of a 2.5D chiplet. The proposed test circuit satisfies the requirements of post-binding testing of chiplets in the 2.5D chiplet and solves the control problem of post-binding testing of chiplets across an interposer. A STACK instruction is configured in the TAP controller and the access to a chiplet test configuration register is selected according to the STACK instruction, and then a control signal representing the information of chiplets under parallel testing and an output sequence of test output signals is generated. In this way, a single chiplet can be selected for individual post-binding testing, or multiple chiplets can be flexibly selected for parallel testing, which greatly shortens the testing time, and validly improves the reliability of parallel testing by abandoning the parallel testing scheme of master-slave testing.

(2) In the circuit for post-binding testing of the 2.5D chiplet proposed by the present disclosure, without modifying the original test structure of chiplets, taking a set of general-purpose JTAG ports on an interposer as external test ports, through connecting the interface circuit of the interposer with the general-purpose JTAG ports between each chiplet, a test vector can be configured for each tested chiplet and a test output signal of each tested chiplet is transmitted to the external test ports. The solution using a set of JTAG ports on the test circuit after bonding to achieve the testing of a single specified chiplet or the parallel testing of multiple chiplets is versatile and easy to use and promote.

DESCRIPTION OF THE EMBODIMENTS

In order to make the objectives, features and advantages of the present disclosure more apparent, specific embodiments of the present disclosure are described in further detail below in conjunction with accompanying drawings, and the described embodiments are some, but not all, embodiments of the present disclosure. All other embodiments, obtained by persons of ordinary skill in the art based on the embodiments of the present disclosure without creative efforts, shall fall within the protection scope of the present disclosure.

In order to better understand the present disclosure, an embodiment of a circuit for post-binding testing of a 2.5D chiplet proposed by the present disclosure is elaborated in detail below.

Figure 1:
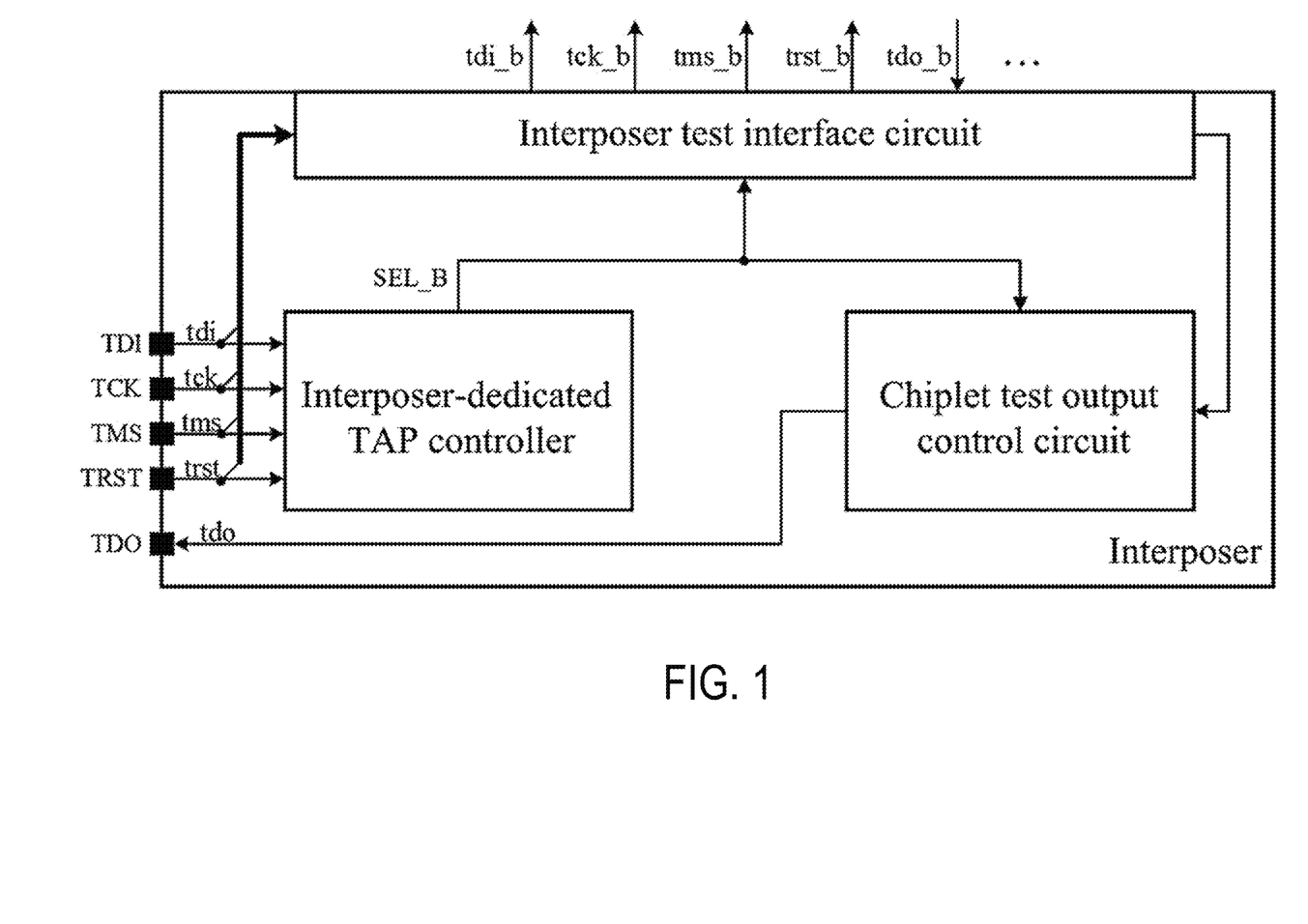
FIG. 1 is a structural block diagram of a circuit for post-binding testing of 2.5D chiplet of the present disclosure.

The main design idea of the circuit for post-binding testing of the 2.5D chiplet according to the embodiment of the present disclosure is: design-for-test on an interposer, inserting the test circuit and inputting the test vector, thus achieving the parallel memory built-in self-testing after multiple chiplets are bonded. The corresponding structural block diagram is shown in FIG. 1. The test circuit of this embodiment includes an interposer-dedicated TAP controller, an interposer test interface circuit and a chiplet test output control circuit. First, a configuration vector is input into the interposer-dedicated TAP controller through four external test ports of a test data input port TDI, a test clock signal input port TCK, a test mode selection signal input port TMS and a test reset signal input port TRST on the interposer, and a value of a SEL_B signal is set. Then, a test vector of chiplets is input into the interposer test interface circuit through the ports TDI, TCK, TMS and TRST as well, and the interposer test interface circuit is used to provide ports tdi_b, tck_b, tms_b, trst_b, tdo_b. Under the control of the SEL_B signal, the ports tdi_b, tck_b, tms_b, trst_b, tdo_b provided by the interposer test interface circuit are connected to the test ports of a selected chiplet to be tested, and the test vector of the chiplet to be tested is generated according to the SEL_B signal and the test vector received from the external test ports. The interposer test interface circuit transmits the test vector of the chiplet to be tested to the test port corresponding to the chiplet to be tested, and testing is performed after the chiplet to be tested has received the test vector. Finally, the test result of the chiplet is entered into the interposer test interface circuit through the port tdo_b, and then is transmitted to the chiplet test output control circuit, and the chiplet test output control circuit, under the control of the signal SEL_B, selects the test output result of the corresponding chiplet to an external test data output port TDO.

Figure 2:
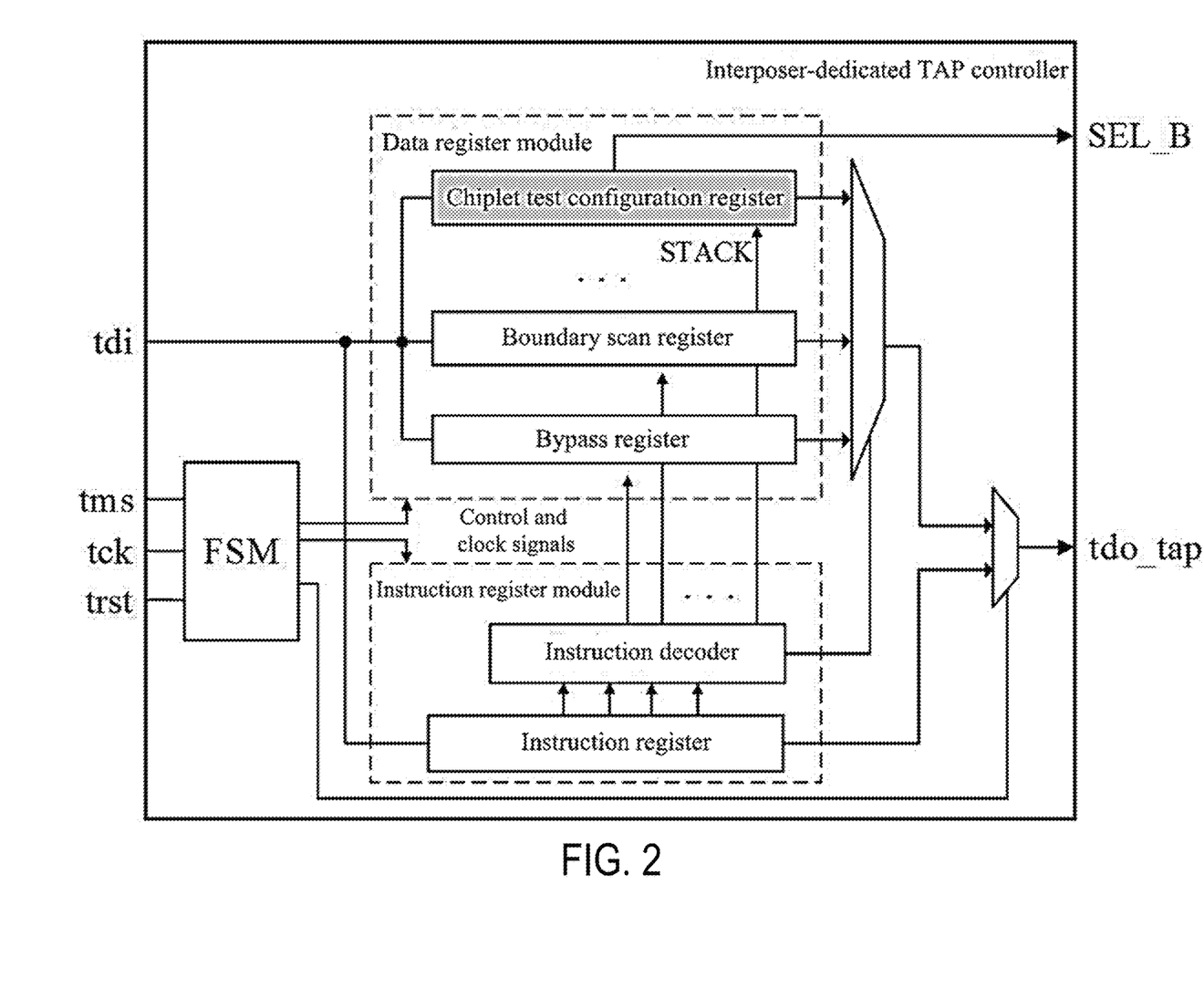
FIG. 2 is a specific structural diagram of the interposer-dedicated TAP controller shown in FIG. 1.

FIG. 2 is a more detailed diagram of the interposer-dedicated TAP controller in FIG. 1. The interposer-dedicated TAP controller includes a finite state machine (FSM), an instruction register module, a data register module, and some combinational logic gates. A new instruction named STACK is defined in the instruction register module, which is used to select and access a newly added chiplet test configuration register in the data register module. The chiplet test configuration register outputs a signal SEL_B, which is the SEL_B signal shown in FIG. 1, providing a control signal for the interposer test interface circuit and the chiplet test output control circuit. The defined value of the STACK instruction is serially shifted in from TDI to the instruction register module. After processing by the instruction decoder, a STACK instruction for selecting the access to the chiplet test configuration register is obtained. When the STACK command is high level, the chiplet test configuration register is connected into a valid path between the test data input port and the test data output port of the interposer-dedicated TAP controller, and the stored data in the chiplet test configuration register (namely, the data so stored in the chiplet test configuration register in FIG. 3) is output as tdo_tap output to the TDO port. When a boundary-scan register or bypass register or instruction register is connected into the valid path between the test data input port and the test data output port of the interposer-dedicated TAP controller, the data stored in the boundary-scan register or bypass register or instruction register is taken as tdo_tap transmitted to the TDO port.

Figure 3:
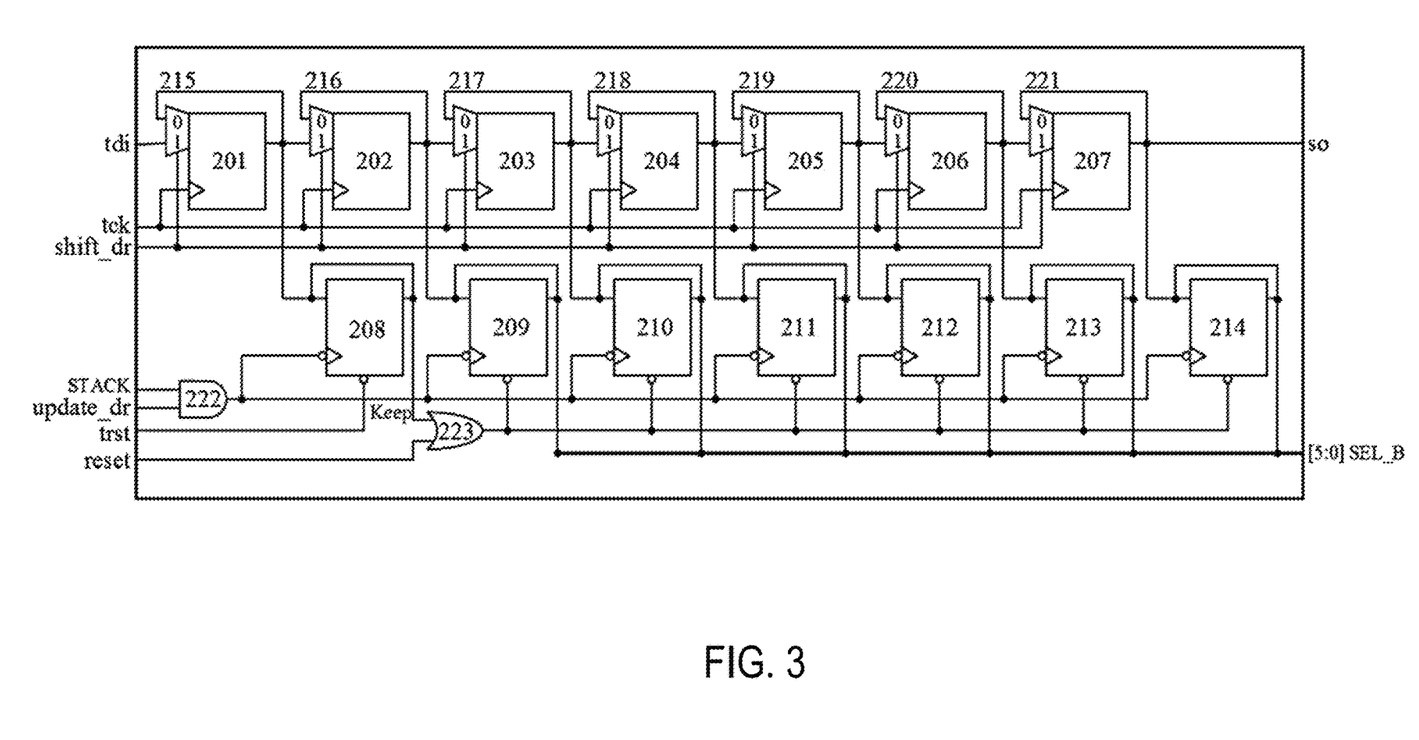
FIG. 3 is a specific structural diagram of the chiplet test configuration register shown in FIG. 2.

FIG. 3 is a more detailed diagram of the chiplet test configuration register in FIG. 2, including the first to fourteenth registers 201-214, the fifteenth to twenty-first data selectors 215-221, and the first AND gate 222 and the first OR gate 223. The clock terminals of the first to seventh registers 201-207 are connected to signal tck input from the test clock signal input port TCK, and when the data register shift enable signal shift_dr generated by the fifteenth to twenty-first data selectors 215-221 at FSM is 1, the test data input signal tdi is shifted into the first to seventh registers 201-207 at the rising edge of tck, and after the test data input signal tdi is shift-processed by the first to seventh registers 201-207, the data so stored in the chiplet test configuration register is output. On the contrary, when shift_dr is 0, the output values of the first to seventh registers 201-207 are fed back to the fifteenth to twenty-first data selectors 215-221 connected to the respective input terminals. In order to have the value of the control signal of the chiplet test configuration register updated only when the STACK instruction is enabled, the signal STACK and a data register update enable signal update_dr generated by FSM are sent to the first AND gate 222, and the output terminal of the first AND gate 222 is connected to the clock terminals of the eighth to fourteenth registers 208-214. When the output of the first AND gate 222 is flipped and on the falling edge of tck, the outputs of the first to seventh registers 201-207 are respectively shifted into the eighth to fourteenth registers 208-214. The eighth register 208 outputs a signal Keep, and the ninth to fourteenth registers 209-214 output a 6-bit signal SEL_B[5:0]. On the contrary, when there is no flip in the output of the first AND gate 222, the outputs of the eighth to fourteenth registers 208-214 remain unchanged. The reset terminal of the eighth register 208 receives an asynchronous reset signal trst from the external TRST port, the output signal Keep of the eighth register 208 and a synchronous reset signal reset from the FSM are sent to the first OR gate 223, and the output of the first OR gate 223 is connected to the reset terminals of the ninth to fourteenth registers 209-214. When the output of the first OR gate 223 is 1, the SEL_B signal keeps the original value unchanged except when the asynchronous reset signal trst is valid, and when it is 0 on the contrary, the signal SEL_B is reset to the initial value 0 after the FSM enters the Test-Logic-Reset state (that is, the signal reset is low level active).

Figure 4:
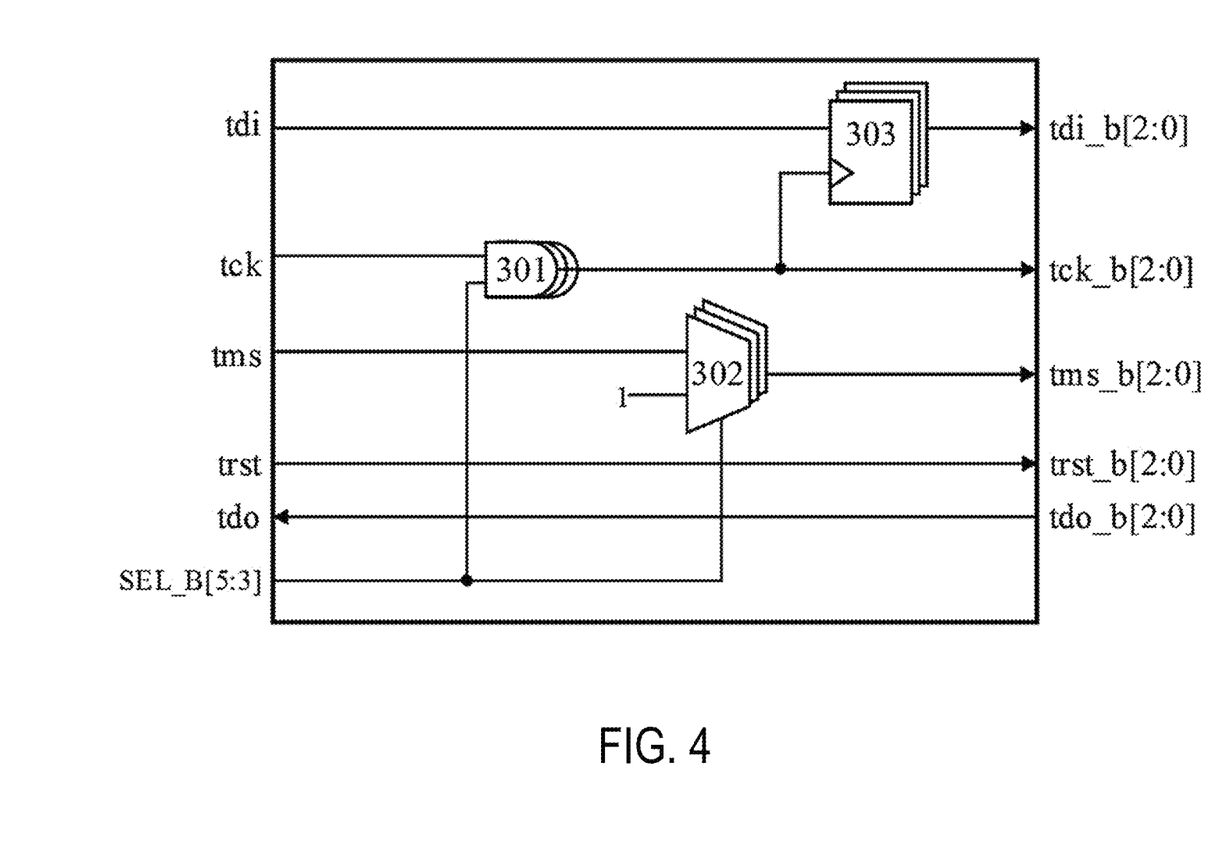
FIG. 4 is a specific structural diagram of the interposer test interface circuit shown in FIG. 1.

FIG. 4 is a more detailed diagram of the interposer test interface circuit in FIG. 1. The interposer test interface circuit includes three AND gates 301, three data selectors 302 and three registers 303, and the ports tdi_b, tck_b, tms_b, trst_b and tdo_b in the interposer test interface circuit are respectively connected to the ports tdi, tck, tms, trst and tdo of the chiplets on the interposer. SEL_B[5], SEL_B[4], and SEL_B[3] (namely, representing the information of tested chiplets under parallel testing) in the signal SEL_B[5:3] are respectively connected to two input terminals of the three AND gates 301 with the signal tck, and three signals tck_b[2], tck_b[1] and tck_b[0] (i.e., tck_b[2:0] in FIG. 4) are output to the port tck_b. When SEL_B is 0, that is, a chiplet is not selected to be tested, the signal input to the port tck_b is kept at 0 to prevent unnecessary power loss caused by flipping. Both the signal tms and the fixed value 1 are connected to the two data input terminals of the three data selectors 302, and the data selection terminals of the three data selectors 302 are respectively 3-bit wide signals SEL_B[5:3]. When SEL_B is 1, the signal tms is directly input to the port tms_b, and when it is 0 on the contrary, the signal corresponding to a chiplet that is not selected for testing is 1, that is, the output signal of the port tms_b is 1. The FSM is prevented from entering the Test_Logic_Reset state when the signal tck_b is not turned off to maintain a synchronous reset. Three registers 303 are added between tdi and tdi_b[2], tdi_b[1] and tdi_b[0] (i.e., tdi_b[2:0] in FIG. 4) respectively. Timing adjustment is performed to eliminate the timing impact of test data during shifting through long paths in the 2.5D Chiplet. The output tck_b[2:0] of the three AND gates 301 are respectively connected to the clock terminals of the three registers 303, and at the rising edge of the output clock signal of the three AND gates 301, the test data tdi shifted in is output to the port tdi_b through the register 303. The port tdo_b is used to transmit the test output of the tested chiplet to an external TDO port. In order to save hardware overhead, no logic is added between port TRST and port trst_b, port tdo_b and port TDO.

Figure 5:
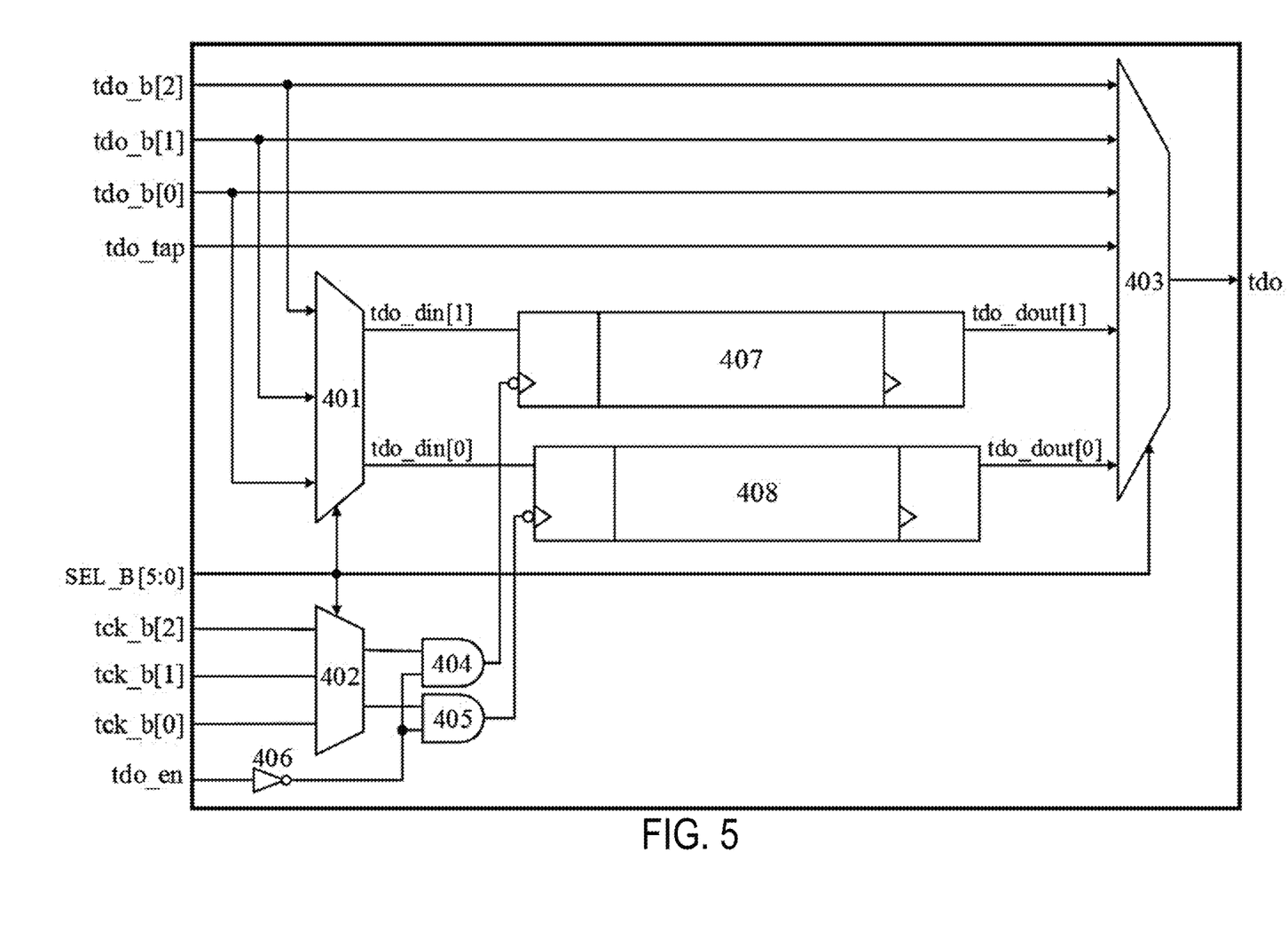
FIG. 5 is a specific structural diagram of the chiplet test output control circuit shown in FIG. 1.

FIG. 5 is a more detailed diagram of the chiplet test output control circuit in FIG. 1. The chiplet test output control circuit includes the first and second 3 to 2 data selectors 401 and 402, a 6 to 1 data selector 403, the second and third AND gates 404 and 405, an inverter 406, and the first and second register banks 407 and 408. Since there is only one external test output port on the interposer, in order to meet the requirements of multi-chiplet parallel testing, a chiplet test output control circuit is designed. The test output signals tdo_b[2], tdo_b[1] and tdo_b[0] of the tested chiplets under parallel testing are connected to the three data input terminals of the first 3 to 2 data selector 401, and according to the value of the data selection signal SEL_B[5:0] on the first 3 to 2 data selector 401 (namely, the SEL_B[5:0] output by the chiplet test configuration register), tdo_din[1] and tdo_din[0] are output to provide data input signals for the first and second register banks 407 and 408. The chiplet test clock signals tck_b[2], tck_b[1] and tck_b[0] on the interposer test interface circuit are connected to the three data input terminals of the second 3 to 2 data selector 402, and according to the value of the data selection signal SEL_B[5:3] on the second 3 to 2 data selector 402 (namely, the data in SEL_B representing the information of tested chiplets under parallel testing), two clock signals are output and then connected to one input terminal of the second and third AND gate 404 and 405 respectively. A test output enable signal tdo_en generated by the interposer-dedicated TAP controller is connected to the other input terminal of the second and third AND gates 404 and 405 through the output of the inverter 406. The output terminals of the second and third AND gates 404 and 405 are respectively connected to the clock terminals of the first and second register banks 407 and 408, which can realize shifting into the register bank of a valid output result of a chiplet that is being tested yet not selected for test result outputting by the port tdo during parallel testing of multiple chiplets. The signals tdo_b[2], tdo_b[1], tdo_b[0], the test output tdo_tap of the interposer-dedicated TAP controller, the output tdo_dout[1] of the first register bank 407, and the output tdo_dout[0] of the second register bank 408 are six data input signals of the 6-to-1 data selector 403, and the 6-to-1 data selector 403 output the signal tdo to the external port TDO on the interposer according to the value of the data selection signal SEL_B[2:0] (namely, the data representing an output sequence of test output signals of tested chiplets under parallel testing).

Figure 6:
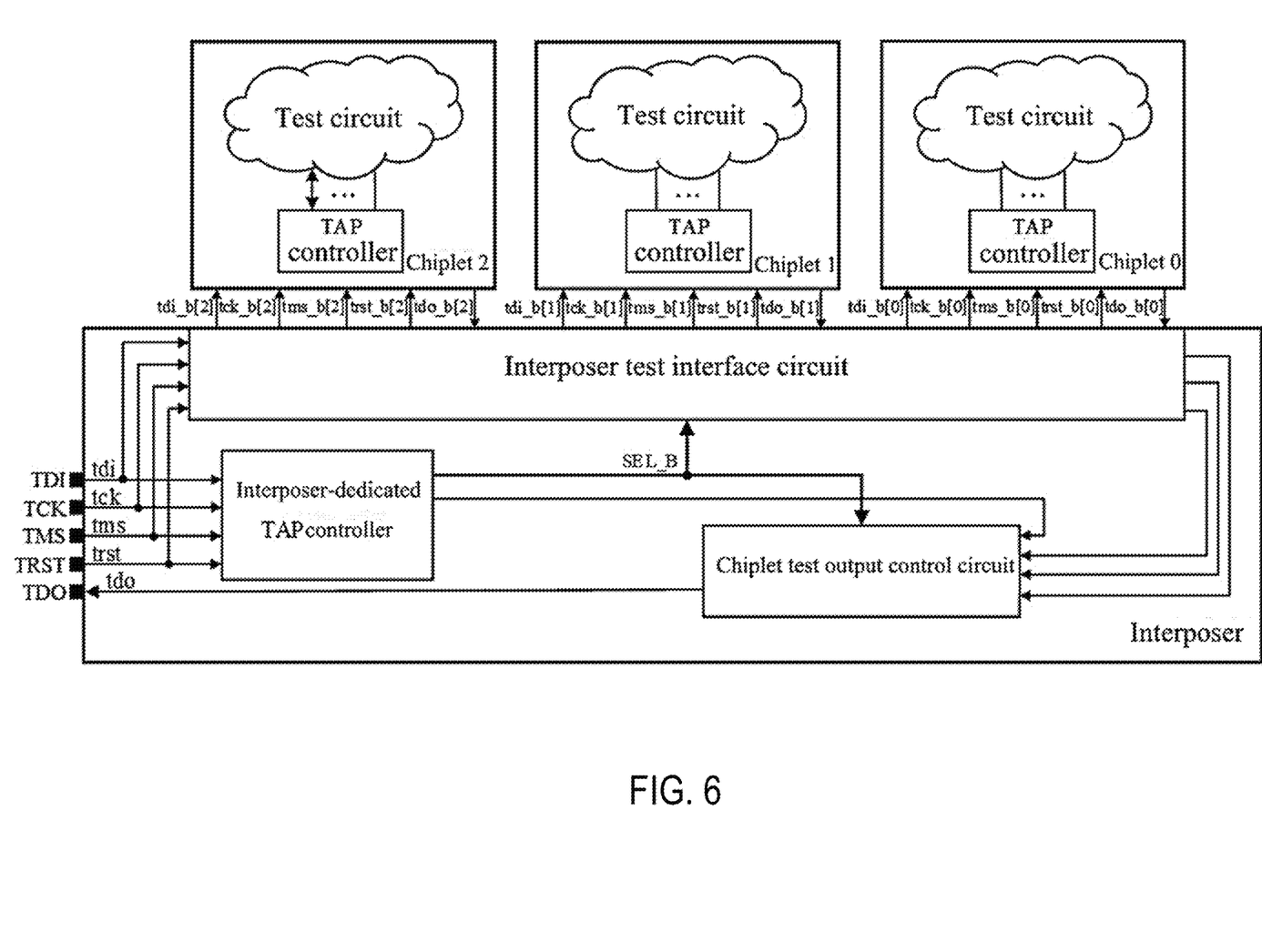
FIG. 6 is a schematic diagram of the overall circuit structure of a circuit for post-binding testing of 2.5D Chiplet according to an embodiment of the present disclosure.

FIG. 6 is a schematic diagram of the overall circuit structure of this embodiment, including 3 chiplets and 1 interposer. The chiplet includes a design-for-test circuit that has been inserted before bonding and cannot be changed. Only two parts, the TAP controller and the test circuit, are shown in the figure. The interposer includes an interposer-dedicated TAP controller, an interposer test interface circuit and a chiplet test output control circuit.

Figure 7:
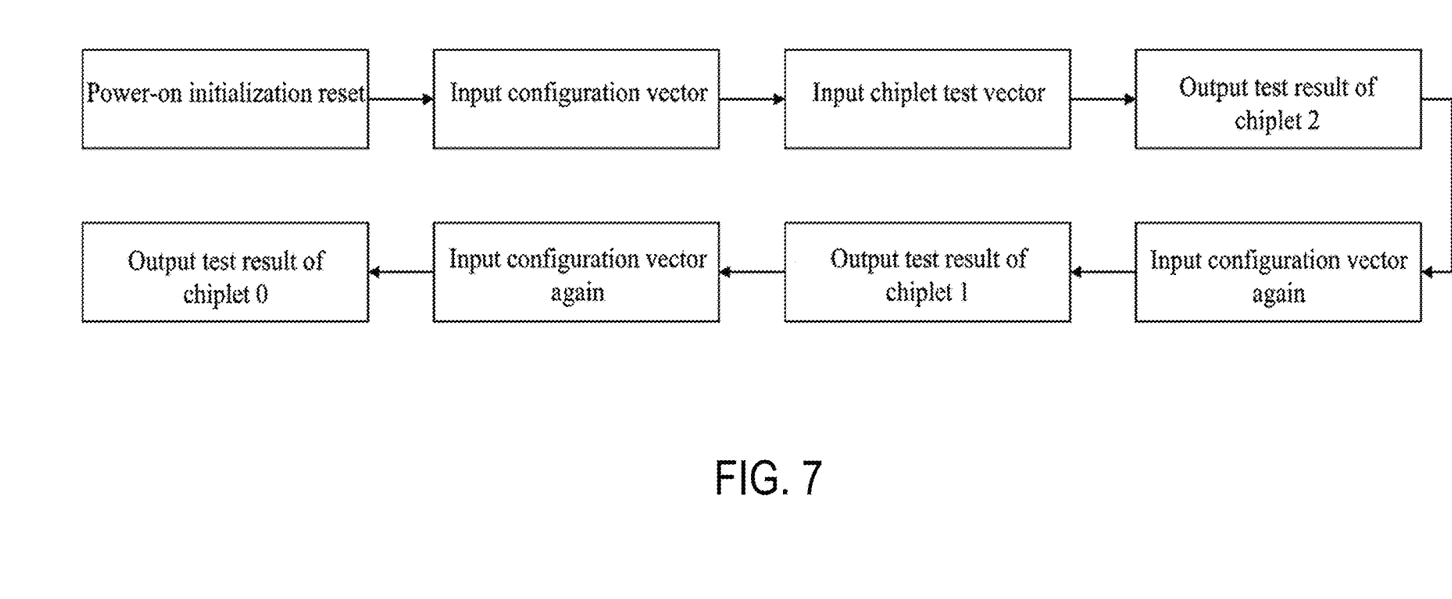
FIG. 7 is a test flow chart of a circuit for post-binding testing of 2.5D chiplet according to an embodiment of the present disclosure.

According to the test flow chart shown in FIG. 7, a memory parallel built-in self-testing is carried out after bonding chiplet 2, chiplet 1 and chiplet 0. Power-on reset of the whole 2.5D Chiplet circuit is performed first, at which time, the test signal channels between the interposer and the three chiplets are in an initial closed state. Then, a configuration vector is input to the interposer-dedicated TAP controller and the STACK instruction mode is entered. The signals Keep and SEL_B are assigned, and the test interface channels between the interposer and chiplet 2, chiplet 1, and chiplet 0 are opened. Then, a test vector of the chiplets is input and the built-in self-testing of chiplet 2, chiplet 1 and chiplet 0 is initiated. At the same time, the TDO port first outputs the test result of chiplet 2, the test result of chiplet 1 is stored in the register bank 1 of the chiplet test output control circuit, and the test result of chiplet 0 is stored in the register bank 0 of the chiplet test output control circuit. After all the chiplets have been tested, the test output of chiplet 2 has also been completed at this time, a configuration vector is input, the STACK instruction mode is entered, the signal SEL_B is reassigned to output the value in register bank 1 of the chiplet test output control circuit, namely, to output the valid test result of chiplet 1. This reassignment for the signal SEL_B changes the data value of the output sequence of test output signals, and the output of the interposer test interface circuit needs to be kept unchanged when reassigning the data in the signal SEL_B representing the information of tested chiplets under parallel testing. The signal SEL_B after assignment initiates the clock signal of a register bank in which the test output signal of one of the two tested chiplets is stored, and selects the output of the register bank to the port of the chip JTAG. After the output of register bank 1 has been completed, a configuration vector is input again, and the signal SEL_B is reassigned again to output the value in register bank 0 of the chiplet test output control circuit, namely, to output the valid test result of chiplet 0. This reassignment for the signal SEL_B is the same as the assignment for the signal SEL_B for outputting the valid test result of chiplet 1.

Figure 8:
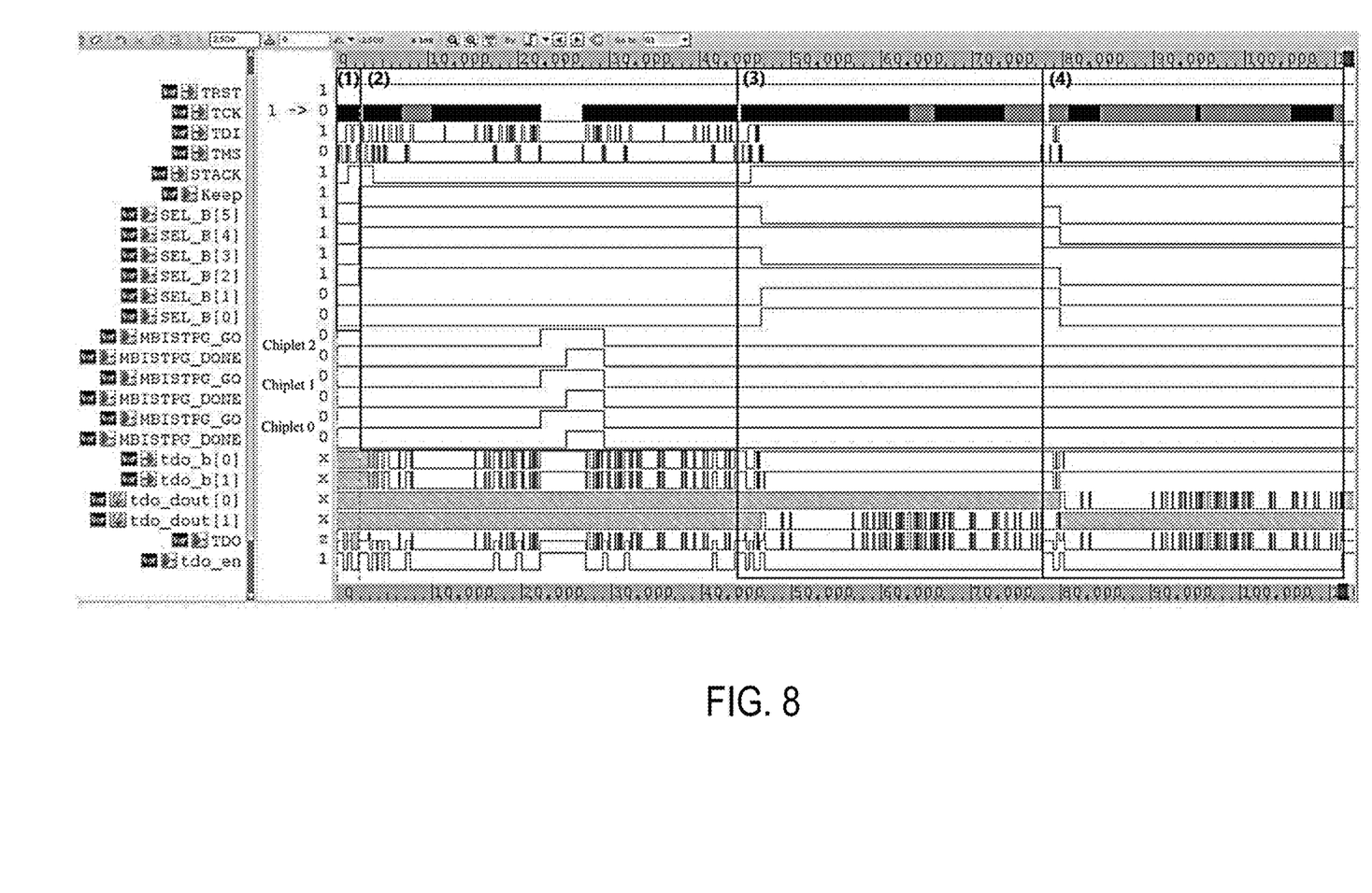
FIG. 8 is a simulation waveform diagram of parallel testing of chiplets using a circuit for post-binding testing of 2.5D chiplet according to an embodiment of the present disclosure.

FIG. 8 is a simulation waveform diagram of parallel testing of chiplet 2, chiplet 1 and chiplet 0 in FIG. 6. The waveforms in box (1) in FIG. 8 correspond to the steps of power-on initialization reset and inputting a configuration vector in FIG. 6. It can be observed that the instruction signal STACK is pulled high, and the signal SEL_B[5:0] has been configured as 6' b111100 and remains unchanged. The waveforms in box (2) in FIG. 8 correspond to the steps of inputting a chiplet test vector and outputting a test result of chiplet 2 in FIG. 6. It can be observed that both indication signals GO and DONE in chiplet 2, chiplet 1 and chiplet 0 have been pulled high (valid), and thus it is determined that the parallel memory built-in self-testing after the bonding of chiplet 2, chiplet 1 and chiplet 0 all passes. The waveforms in box (3) in FIG. 8 correspond to the steps of again inputting a configuration vector and outputting a test result of chiplet 1 in FIG. 6. It can be observed that the signal SEL_B[5:0] is reconfigured to 6'b010111, so that the value of the register bank 407 in the chiplet test output control circuit is output from TDO, that is, the valid test result of chiplet 1 is output. The waveforms in box (4) in FIG. 8 correspond to the steps of again inputting a configuration vector and outputting a test result of chiplet 0 in FIG. 6. It can be observed that the signal SEL_B[5:0] is reconfigured to 6'b001000, so that the value of the register bank 408 in the chiplet test output control circuit is output from TDO, that is, the valid test result of chiplet 0 is output.

Preferably, if the test requirement of chiplets is changed, post-binding testing of chiplets that are flexibly selected can be achieved by customizing configuration of the value of signal SEL_B by above-mentioned steps. For example, when performing parallel testing on a multi-Chiplet integrated circuit containing N chiplets, n chiplets therein are selected as the object of parallel testing. The signal SEL_B can be expressed as SEL_B[2n−1:0], where n bits of data is used to represent the information of tested chiplets under parallel testing, and the remaining n bits of data is used to represent an output sequence of test output signals of tested chiplets under parallel testing. When $2 \leq n \leq N$, the signal SEL_B indicates that any n chiplets in the N chiplets are tested in parallel. After receiving a test vector of each tested chiplet generated by the interposer test interface circuit, the n tested chiplets are subjected to built-in self-testing simultaneously. Compared with the multi-Chiplet parallel testing solution of the master-slave architecture, upon failure of any tested chiplet, the remaining tested chiplets can still be tested, realizing reliable parallel testing of multiple Chiplets. When n=1, the signal SEL_B indicates that an individual specified test is performed on one of the N chiplets. This makes the multi-Chiplet parallel testing solution proposed by the present application more flexible. On the other hand, during the entire test process, the assignment of the signal SEL_B also has certain flexibility. In the process of sequentially outputting the test output signals of the tested chiplets, the data in the signal SEL_B representing the information of tested chiplets can be assigned arbitrarily on the premise of ensuring that the output of the interposer test interface circuit remains unchanged.

It should be noted that the above is only preferred embodiments of the present disclosure, not as a further limitation to the present disclosure, and all equivalent changes made from the description of the present disclosure and the accompanying drawings fall within the protection scope of the present disclosure.

What is claimed is:

1. A circuit for post-binding testing of a 2.5D chiplet, wherein a parallel testing is performed on a multi-chiplet integrated circuit comprising N chiplets, the circuit for post-binding testing of the 2.5D chiplet comprising:
an interposer-dedicated TAP controller configured to receive a configuration vector from a port of a chip JTAG and output a control signal for determining tested chiplets under parallel testing and an output sequence of test output signals;
an interposer test interface circuit configured to receive a test vector from the port of the chip JTAG, and when receiving the control signal output by the interposer-dedicated TAP controller, to connect to a test data input port, a test clock signal input port, a test mode selection signal input port, a test reset signal input port and a test data output port of the tested chiplets under parallel testing, where a test clock signal of each tested chiplet that is generated according to the control signal output by the interposer-dedicated TAP controller and a test clock input signal from the port of the chip JTAG is transmitted to the test clock signal input port of each tested chiplet, a test mode selection signal of each tested chiplet that is generated according to the control signal output by the interposer-dedicated TAP controller and a test mode selection signal from the port of the chip JTAG is transmitted to the test mode selection signal input port of each tested chiplet, a test data input signal of each tested chiplet that is shifted in according to the test clock signal of each tested chiplet is transmitted to the test data input port of each tested chiplet, a test reset signal from the port of the chip JTAG is transmitted to the test reset signal input port of each tested chiplet, and a test output signal of each tested chiplet is transmitted to a chiplet test output control circuit; and
the chiplet test output control circuit configured to receive the control signal output by the interposer-dedicated TAP controller, and sequentially transmit the test output signal of each tested chiplet to the port of the chip JTAG.

2. The circuit for post-binding testing of the 2.5D chiplet according to claim 1, wherein the interposer-dedicated TAP controller comprises an instruction register module and a data register module comprising a chiplet test configuration register, where the configuration vector, after being processed by the instruction register module, generates an instruction to connect the chiplet test configuration register in a valid path between the test data input port and the test data output port of the interposer-dedicated TAP controller, and the chiplet test configuration register, after being connected in the valid path, generates the control signal for determining tested chiplets under parallel testing and an output sequence of test output signals according to the test data input signal from the port of the chip JTAG.

3. The circuit for post-binding testing of the 2.5D chiplet according to claim 1, wherein the control signal for determining tested chiplets under parallel testing and an output sequence of test output signals is a signal SEL_B[2n−1:0] with 2n bits of data, where n bits data is used to represent the information of the tested chiplets under parallel testing, and the remaining n bits of data is used to represent the output sequence of test output signals of the tested chiplets under parallel testing, 1≤n≤N.

4. The circuit for post-binding testing of the 2.5D chiplet according to claim 3, wherein the interposer test interface circuit comprises:
n AND gates, one input terminal of each AND gate receiving a test clock input signal from the port of the chip JTAG, the other input terminal of each AND gate receiving one bit of data of n bits of data representing the information of tested chiplets under parallel testing, and each AND gate outputting a test clock signal of a tested chiplet;
n data selectors, one input terminal of each data selector receiving a test mode selection signal from the port of the chip JTAG, the other input terminal of each data selector receiving high level, a data selection terminal of each data selector receiving one bit of data of n bits of data representing the information of tested chiplets under parallel testing, and each data selector outputting a test mode selection signal of a tested chiplet; and
n registers, an input terminal of each register receiving a test data input signal from the port of the chip JTAG, a clock terminal of each register being connected to an output terminal of an AND gate, and each register outputting a test data input signal of a tested chiplet.

5. The circuit for post-binding testing of the 2.5D chiplet according to claim 3, wherein the chiplet test output control circuit comprises:
a test clock signal multiplexer, each of n input terminals thereof respectively receiving a test clock input signal of a tested chiplet, a data selection terminal thereof receiving the control signal representing the information of tested chiplets under parallel testing, and each of n−1 output terminals thereof respectively outputting a test clock signal of a tested chiplet;
an input signal multiplexer, each of n input terminals thereof respectively receiving a test output signal of a tested chiplet, a data selection terminal thereof receiving the control signal representing tested chiplets under parallel testing and an output sequence of test output signals, and each of n−1 output terminals thereof being respectively connected to an input terminal of a register bank;
n−1 AND gates, one input terminal of each AND gate being connected to an output terminal of the test clock signal multiplexer, the other input terminal of each AND gate receiving an opposite value of a test output enable signal from the interposer-dedicated TAP controller, and each AND gate outputting a clock signal that stores a test output signal of a tested chiplet into a register bank;
n−1 register banks, an input terminal of each register bank being connected to an output terminal of the input signal multiplexer, a clock terminal of each register bank being connected to an output terminal of an AND gate, and each register bank outputting a valid test output signal of a tested chiplet that is stored therein; and
an output signal multiplexer, each of 2n input terminals thereof respectively receiving a test output signal of a chiplet, an output signal of a register bank, and an output signal of an interposer-dedicated TAP controller, a data selection terminal thereof receiving the control signal representing the tested chiplets under parallel testing and the output sequence of test output signals, and an output terminal thereof sequentially transmitting the test data output signal of each tested chiplet to the port of the chip JTAG.

6. The circuit for post-binding testing of the 2.5D chiplet according to claim 3, wherein the chiplet test configuration register comprises:
- a shift register bank consisting of the first to (2n+1)-th registers, an input terminal of each register being connected to an output terminal of a two-to-one data selector, a "0" terminal of the data selector being connected to an output terminal of a register connected thereto, a "1" terminal of the data selector that is connected to the first register receiving the configuration vector from the chip JTAG, a "1" terminal of the data selector that is connected to the i-th register being connected to an output terminal of the i−1-th register, a data terminal of each data selector receiving a shift enable signal from the interposer-dedicated TAP controller, a clock terminal of each register receiving a test clock input signal from the port of the chip JTAG, and the (2n+1)-th register outputting data stored in the chiplet test configuration register, $2 \le i \le 2n\ 1$;
- an AND gate, one input terminal thereof receiving an instruction to connect the chiplet test configuration register in a valid path between the test data input port and the test data output port of the interposer-dedicated TAP controller, and the other input terminal thereof receiving a data register update enable signal from the interposer-dedicated TAP controller;
- an OR gate, one input terminal thereof being connected to an output terminal of the (2n+2)-th register, and the other input terminal thereof receiving a synchronous test reset signal from the interposer-dedicated TAP controller; and
- (2n+2) to (4n+2)-th registers, both input and output terminals of the (2n+2)-th register being connected to an output terminal of the first register, both input and output terminals of the j-th register being connected to an output terminal of the i-th register, a clock terminal of each register of the (2n+2) to (4n+2)-th registers being connected to the output terminal of the AND gate, a reset terminal of the (2n+2)-th register receiving an asynchronous test reset signal from the port of the chip JTAG, a clock terminal of each register of the (2n+3) to (4n+2)-th registers being connected to the output terminal of the OR gate, and each bit of data output by the (2n+3) to (4n+2)-th registers constituting the control signal for determining tested chiplets under parallel testing and an output sequence of test output signals, $2n+3 \le j \le 4n+2$.

7. A method for post-binding testing of a 2.5D chiplet, comprising:
- after power-on initialization reset of the circuit for testing of claim 6, inputting a configuration vector to the port of the chip JTAG for connecting the test data input port, the test clock signal input port, the test mode selection signal input port, the test reset signal input port, and the test data output port of a tested chiplet to the interposer test interface circuit;
- inputting a test vector to the port of the chip JTAG, a test output signal of one of the tested chiplets being directly output to the port of the chip JTAG, and test output signals of the remaining n−1 tested chiplets waiting for outputting in sequence;
- sequentially inputting n−1 configuration vectors to the port of the chip JTAG, each input configuration vector selecting the test output signal of one of the n−1 tested chiplets as an output object.

8. The method for post-binding testing of the 2.5D chiplet according to claim 7, wherein the n−1 configuration vectors input sequentially to the port of the chip JTAG are used to perform n−1 assignments to the control signal for determining tested chiplets under parallel testing and an output sequence of test output signals, and the basis for each assignment is to initiate the clock signal of a register bank in which the test output signal of one of the n−1 tested chiplets is stored, and to select the output of the register bank to the port of the chip JTAG.

\* \* \* \* \*